(12) United States Patent
Ide et al.

(10) Patent No.: US 9,252,062 B2
(45) Date of Patent: Feb. 2, 2016

(54) SEMICONDUCTOR DEVICE HAVING OPTICAL FUSE AND ELECTRICAL FUSE

(71) Applicant: PS4 Luxco S.a.r.l., Luxembourg (LU)

(72) Inventors: Akira Ide, Tokyo (JP); Manabu Ishimatsu, Tokyo (JP); Kentaro Hara, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 85 days.

(21) Appl. No.: 14/162,671

(22) Filed: Jan. 23, 2014

(65) Prior Publication Data

US 2014/0141543 A1 May 22, 2014

Related U.S. Application Data

(63) Continuation of application No. 13/137,849, filed on Sep. 16, 2011, now Pat. No. 8,644,086.

(30) Foreign Application Priority Data

Sep. 17, 2010 (JP) ................................ 2010-208995

(51) Int. Cl.
*G11C 7/00* (2006.01)
*H01L 21/66* (2006.01)
*G11C 29/00* (2006.01)

(52) U.S. Cl.
CPC .............. *H01L 22/14* (2013.01); *G11C 29/787* (2013.01); *G11C 29/789* (2013.01); *G11C 29/802* (2013.01); *H01L 2924/0002* (2013.01)

(58) Field of Classification Search
CPC ....... G11C 29/50; G11C 29/02; G11C 11/401

USPC ....................................... 365/201, 225.7, 200
See application file for complete search history.

(56) References Cited

U.S. PATENT DOCUMENTS

| | | | |
|---|---|---|---|
| 6,201,733 B1 | 3/2001 | Hiraki et al. | |
| 6,285,603 B1 | 9/2001 | Ku et al. | |
| 6,388,941 B2 | 5/2002 | Otori et al. | |
| 6,392,938 B1 | 5/2002 | Choi et al. | |
| 6,804,156 B2 | 10/2004 | Ito | |
| 7,263,010 B2 | 8/2007 | Iwai et al. | |
| 7,313,038 B2 | 12/2007 | Otsuka | |
| 7,460,421 B2 | 12/2008 | Kohara | |
| 7,633,785 B2 * | 12/2009 | Kim et al. ........................ 365/51 |
| 2002/0006062 A1 | 1/2002 | Otori et al. | |
| 2002/0196681 A1 | 12/2002 | Tanizaki | |

(Continued)

FOREIGN PATENT DOCUMENTS

| | | |
|---|---|---|
| JP | 200-149588 A | 5/2000 |
| JP | 2002-025289 A | 1/2002 |

(Continued)

*Primary Examiner* — Son Dinh
(74) *Attorney, Agent, or Firm* — Kunzler Law Group, PC

(57) ABSTRACT

A method for manufacturing a stacked semiconductor memory device includes testing a plurality of memory chips to detect first defective addresses, programming optical fuses with first defective address information on each of the plurality of memory chips that have the first defective addresses, stacking the plurality of memory chips, testing the stacked memory chips to detect second defective addresses, and programming electrical fuses with second defective address information.

15 Claims, 15 Drawing Sheets

(56) References Cited

U.S. PATENT DOCUMENTS

| | | |
|---|---|---|
| 2003/0016570 A1 | 1/2003 | Nakahara et al. |
| 2003/0123301 A1* | 7/2003 | Jang et al. ............... 365/200 |
| 2006/0239055 A1 | 10/2006 | Sonoda et al. |
| 2007/0102762 A1* | 5/2007 | Matsushima ............ 257/347 |
| 2010/0195425 A1 | 8/2010 | Urakawa et al. |
| 2011/0141828 A1* | 6/2011 | Yoko ...................... 365/189.09 |
| 2013/0051167 A1 | 2/2013 | Iwai et al. |

FOREIGN PATENT DOCUMENTS

| | | |
|---|---|---|
| JP | 2002-25292 A | 1/2002 |
| JP | 2003-7081 A | 1/2003 |
| JP | 2003-85994 A | 3/2003 |
| JP | 2006-294093 A | 10/2006 |
| JP | 2007-328914 | 12/2007 |
| JP | 2010-182366 A | 8/2010 |
| JP | 2013-51011 A | 3/2013 |

* cited by examiner

SEMICONDUCTOR DEVICE HAVING OPTICAL FUSE AND ELECTRICAL FUSE

The present application is a Continuation application of U.S. patent application Ser. No. 13/137,849 filed on Sep. 16, 2011, which is based on and claims priority from Japanese Patent Application No. 2010-208995, filed on Sep. 17, 2010, the entire contents of which is incorporated herein by reference.

BACKGROUND OF THE INVENTION

1. Field of the Invention

The present invention relates to a semiconductor device, and more particularly to a semiconductor device in which defective memory cells can be replaced with redundant cells.

2. Description of Related Art

Semiconductor memories typified by a DRAM (Dynamic Random Access Memory) include a large number of memory cells, some of which inevitably become defective due to manufacturing conditions and other factors. In order to ship such semiconductor memories as conforming products, the redundancy repair technique of replacing defective memory cells with redundant cells is needed.

According to the redundancy repair technique, a semiconductor memory in a wafer state is initially subjected to an operation test to detect the addresses of defective memory cells (defect addresses). The detected addresses are programmed into optical fuses in the semiconductor memory. Optical fuses are fuses that can be blown by irradiation of a laser beam or the like. Since blown optical fuses cannot be restored to a conducting state again, it is possible to store information in a nonvolatile and irreversible manner. When access is requested to the addresses programmed in the optical fuses, redundant cells (alternative cells) are accessed instead of the defective memory cells, whereby the addresses are repaired.

Memory cell defects occur mainly in the wafer stage (manufacturing steps for forming a plurality of circuits on a wafer; so-called front-end processes). Most defects are therefore repaired by replacement using optical fuses. However, new defects can occur after the replacement using optical fuses, in back-end processes including assembly. For example, new defects may occur due to a thermal load during packaging. It is not possible to repair such defects by using the optical fuses.

As a solution to the problem, Japanese Patent Application Laid-Open No. 2002-25289 (Patent Document 1) proposes a semiconductor device that can implement both the replacement using optical fuses and replacement using electrical fuses. The semiconductor device described in Patent Document 1, however, has had the problem that the need to provide both optical fuses and electrical fuses in a single chip increases the die size.

Japanese Patent Application Laid-Open No. 2007-328914 (Patent Document 2) proposes a method of storing post-packaging defective addresses of a volatile memory (first semiconductor device) into a nonvolatile memory (second semiconductor device) which is mounted on the same module substrate, and loading the defective addresses from the second semiconductor device to the first semiconductor device at startup. According to such a method, the volatile memory to be repaired, such as a DRAM, need not include electrical fuses. It is therefore possible to suppress the increase in die size.

According to the method described in Patent Document 2, however, defective addresses are loaded through external terminals of the first semiconductor device. The inventors have recognized that it interfered with an initialization operation between a memory controller and the memory module impossible during the loading period. An event therefore arises since it takes time to start up the memory module.

SUMMARY

A method for manufacturing a stacked semiconductor memory device comprising testing a plurality of memory chips to detect first defective addresses, programming optical fuses with first defective address information on each of the plurality of memory chips that have the first defective addresses, stacking the plurality of memory chips, testing the stacked memory chips to detect second defective addresses, and programming electrical fuses with second defective address information.

In one embodiment, there is provided a semiconductor device that includes an external terminal; a plurality of first chips each of which includes a plurality of memory cells; a second chip that communicates with outside of the semiconductor device through the external terminal and controls the plurality of first chips; and a plurality of internal wirings connected between the first chips and the second chip, each of the internal wirings including a plurality of through electrodes, each of the through electrodes penetrating through a corresponding one of the first chips, wherein the plurality of first chips communicates with the outside of the semiconductor device through the second chip without directly communicating with the outside, the second chip includes an electrical fuse, and each of the first chips further includes: an optical fuse; a first latch circuit that stores information on the optical fuse; a second latch circuit that stores information on the electrical fuse supplied from the second chip through the internal wirings; a select circuit that selects one of the information stored in the first and second latch circuits; and a first control circuit that generates a redundancy determination signal based on the information selected by the select circuit.

In another embodiment, there is provided a semiconductor device that includes an external signal terminal; a plurality of core chips each of which includes a plurality of memory cells, the core chips being not directly connected to the external signal terminal; and an interface chip connected to the external signal terminal and controls the plurality of core chips, wherein the core chips and the interface chip are stacked on one another, the core chips are electrically connected to the interface chip via through electrodes, each of the through electrodes penetrating through a corresponding one of the core chips, the interface chip includes an electrical fuse storing an address of a defective memory cell included in any of the core chips, each of the core chips further includes: a redundant cell that replaces the defective memory cell; an optical fuse storing the address of the defective memory cell; a select circuit that selects one of an address read from the optical fuse and the electrical fuse; and an access control circuit that accesses the redundant cell instead of the defective memory cell in response to a request for access to the address selected by the select circuit.

According to the present invention, the information on the electrical fuse is transferred from the second chip to the first chips via the through electrodes. This eliminates the need to provide electrical fuses on the first chips. The disuse of the external terminal in transferring the information prevents an increase in the startup time of the semiconductor device.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENT

A representative example of the technical concept of the present invention for solving the events will be described below. It will be understood that what is claimed by the present invention is not limited to such a technical concept and is set forth in the claims of the present invention.

The technical concept of the semiconductor device according to the present invention is to stack a plurality of core chips where the back-end unit is integrated and an interface chip where the front-end unit is integrated, provide optical fuses (laser fuses) on the core-chip side, provide electrical fuses on the interface-chip side, and transfer information on the electrical fuses to the core chips via through electrodes. Since the electrical fuses need not be provided on the core-chip side, it is possible to prevent an increase in the area of the core chips. Since the information on the electrical fuses is transferred to the core chips via the through electrodes, there is no interference with an initialization operation that the interface chip needs to perform with a memory controller outside the semiconductor device through external terminals of the semiconductor device.

Figure 1:
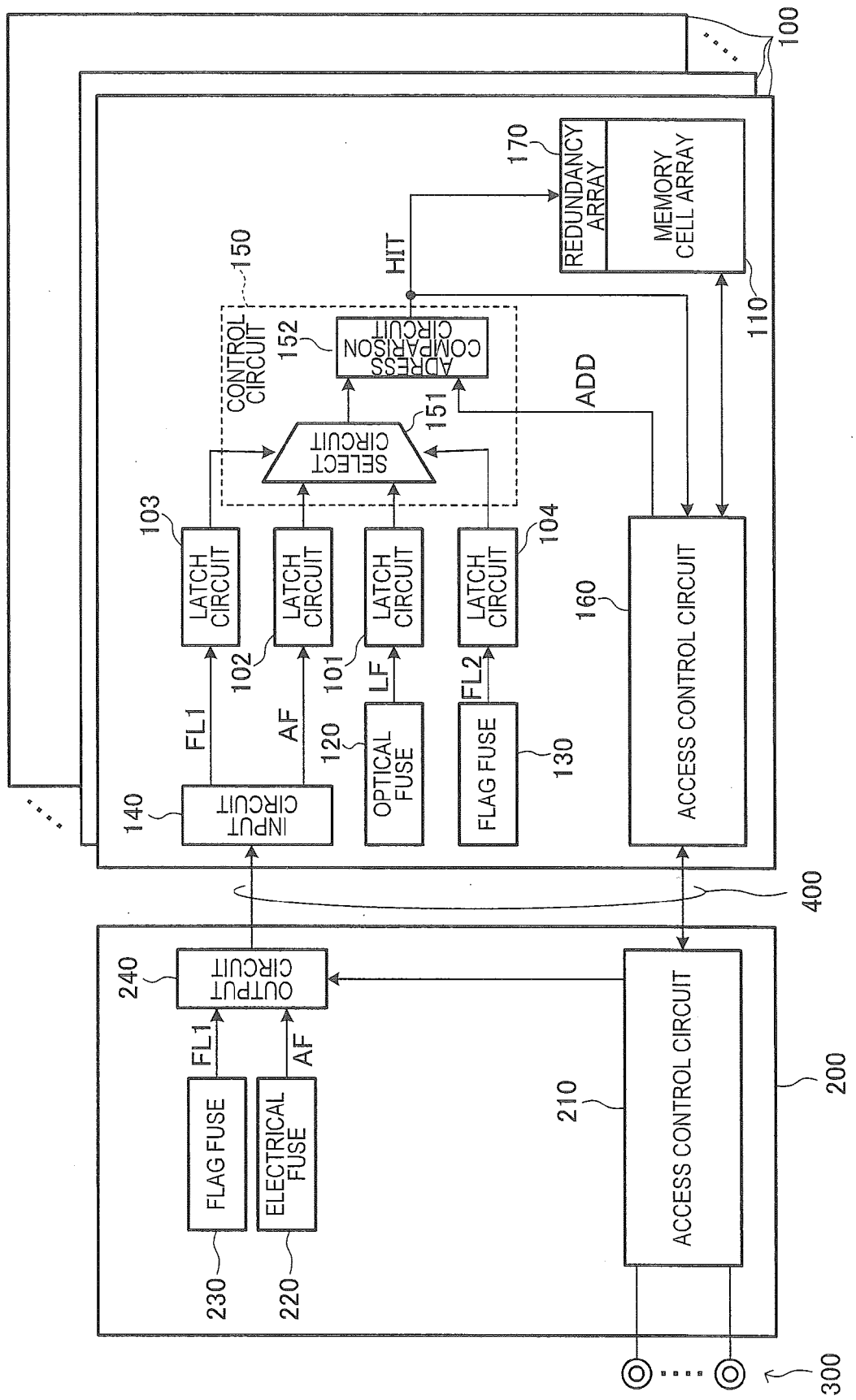
FIG. 1 is a block diagram for explaining the principle of the present invention.

FIG. 1 is a block diagram for explaining the principle of the present invention.

As shown in FIG. 1, the semiconductor device according to the present invention includes a plurality of first chips 100 and a second chip 200. The plurality of first chips 100 have the same circuit configuration, each including a memory cell array 110 which includes a plurality of memory cells. The first chips 100 perform communication through the second chip 200 without directly communicating with outside of the semiconductor device, and therefore are not directly connected to external terminals 300. The plurality of first chips 100 and the second chip 200 are connected to each other through respective corresponding internal wirings 400. The internal wirings 400 include through electrodes that penetrate through the substrates of the respective corresponding first chips 100.

The second chip 200 is a chip that controls the plurality of first chips 100, and is directly connected to the external terminals 300 for the sake of communication with outside of the semiconductor device. The second chip 200 includes an access control circuit 210, an electrical fuse 220, and a flag fuse 230. The flag fuse 230 has the same structure as that of the electrical fuse 220, and contains first flag information FL1 which indicates whether or not information is set in the electrical fuse 220. Electrical fuse information AF programmed in the electrical fuse 220 and the flag information FL1 programmed in the flag fuse 230 are supplied to an output circuit 240. The output circuit 240 functions to supply the electrical fuse information AF and the flag information FL1 to the first chips 100 through the internal wirings 400.

The first chips 100 each include an optical fuse 120 and a first latch circuit 101 that retains optical fuse information LF programmed in the optical fuse 120. The first chips 100 each further include a flag fuse 130. The flag fuse 130 has the same structure as that of the optical fuse 120, and contains second flag information FL2 which indicates whether optical fuse information LF is set in the optical fuse 120. The second flag information FL2 is latched by a fourth latch circuit 104.

The electrical fuse information AF and the first flag information FL1, transferred from the second chip 200 through the internal wirings 400, are received by an input circuit 140 which is arranged in each first chip 100. The electrical fuse information AF and the first flag information FL1 received are latched by a second latch circuit 102 and a third latch circuit 103, respectively.

The optical fuse information LF latched in the first latch circuit and the electrical fuse information AF latched in the second latch circuit are supplied to a select circuit 151 which is included in a control circuit 150. The select circuit 151 is a circuit that selects either one of the optical fuse information LF and the electrical fuse information AF. The selection is made based on the first and second flag information FL1 and FL2 latched in the third and fourth latch circuits 103 and 104. The optical fuse information LF or electrical fuse information AF selected is supplied to an address comparison circuit 152 which is included in the control circuit 150.

The address comparison circuit 152 is a circuit that compares the optical fuse information LF or electrical fuse information AF selected with an access-requested address ADD. If the two coincide, the address comparison circuit 152 activates a redundancy determination signal HIT. When the redundancy determination signal HIT is activated, an access control circuit 160 stops accessing the memory cell array 110 and accesses a redundancy array 170 including redundant cells instead. As a result, redundant cells are accessed instead of defective memory cells.

Preferred embodiments of the present invention will be explained below in detail with reference to the accompanying drawings.

Figure 2:
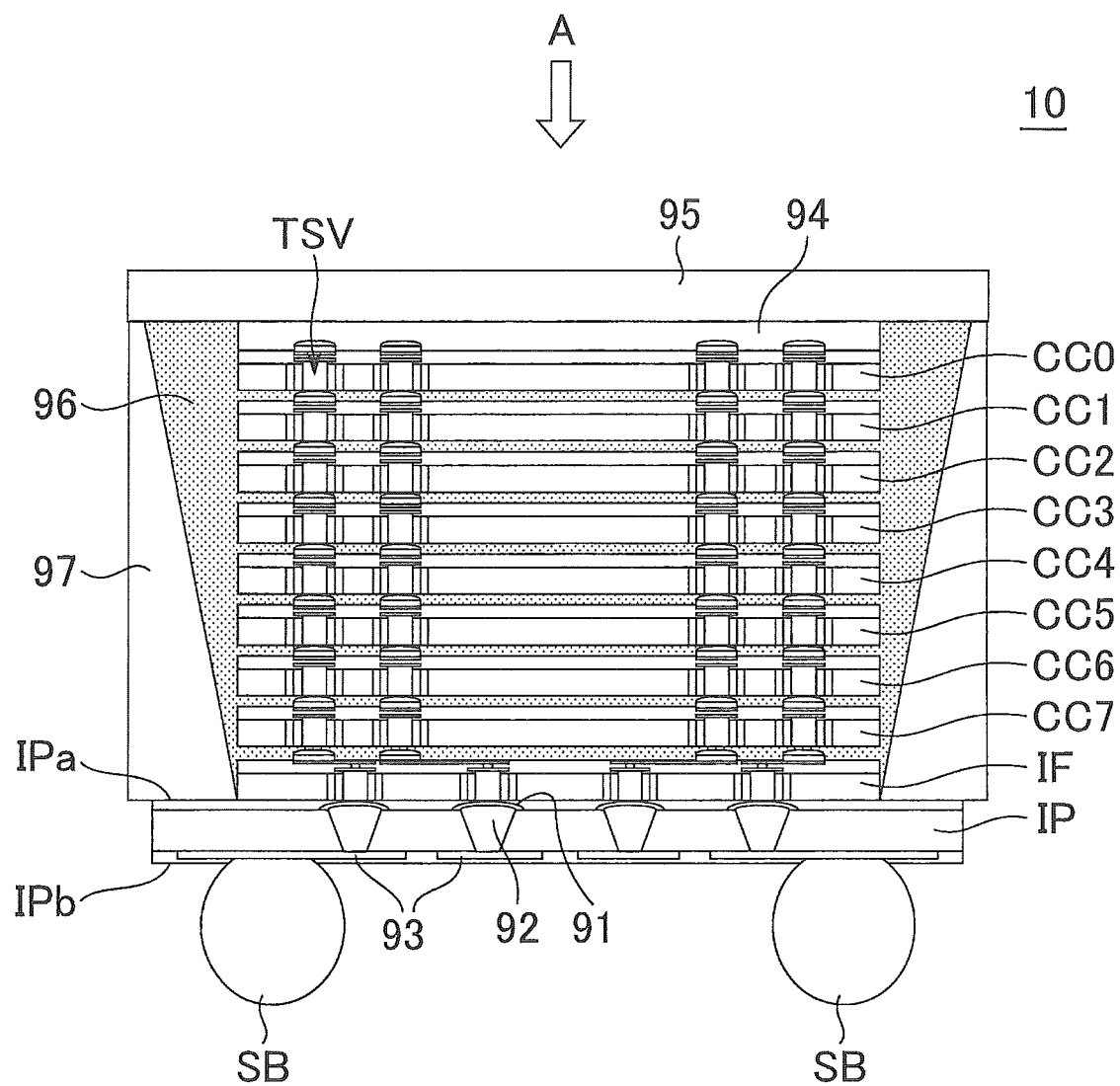
FIG. 2 is a schematic cross-sectional view provided to explain the structure of a semiconductor device 10 according to a preferred embodiment of the present invention.

FIG. 2 is a schematic cross-sectional view provided to explain the structure of a semiconductor device 10 according to the preferred embodiment of the present invention.

As shown in FIG. 2, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/ serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. The interface chip IF has a front end function for communicating with the external device at a first operation frequency, and the plural core chips CC0 to CC7 have a back end function for communicating with only the interface chip IF at a second operation frequency lower than the first operation frequency. Accordingly, each of the plural core chips CC0 to CC7 includes a memory cell array that stores plural information, and a bit number of plural read data for each I/O (DQ) that are supplied from the plural core chips CC0 to CC7 to the interface chip IF in parallel is plural and associated with a one-time read command provided from the interface chip IF to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 2, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 2, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 3A:
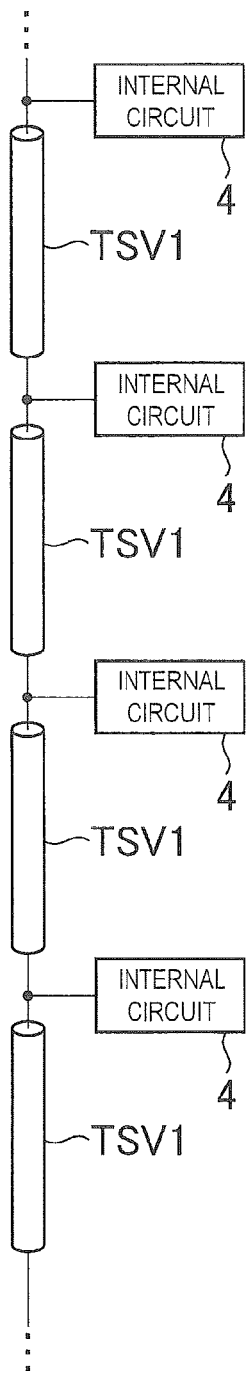
FIGS. 3A to 3C are diagrams showing the various types of through silicon vias TSV provided in a core chip.

When most of the through silicon vias TSV provided in the core chips CC0 to CC7 are two-dimensionally viewed from a lamination direction, that is, viewed from an arrow A shown in FIG. 2, the through silicon vias TSV are short-circuited from the through silicon vias TSV of other layers provided at the same position. That is, as shown in FIG. 3A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 3A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 3B:
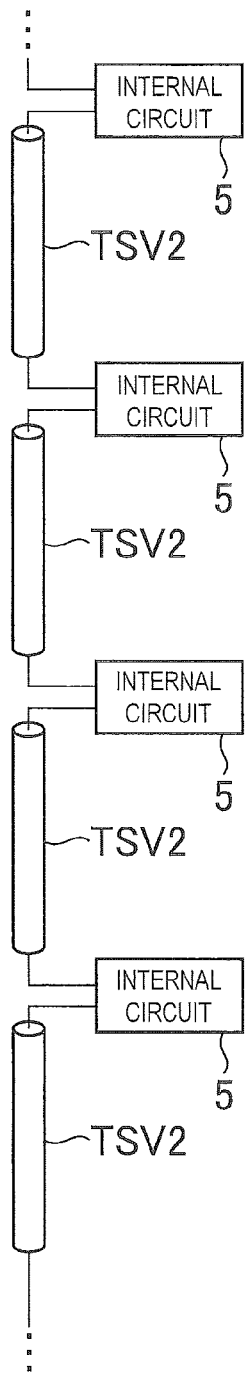

Meanwhile, as shown in FIG. 3B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 3C:
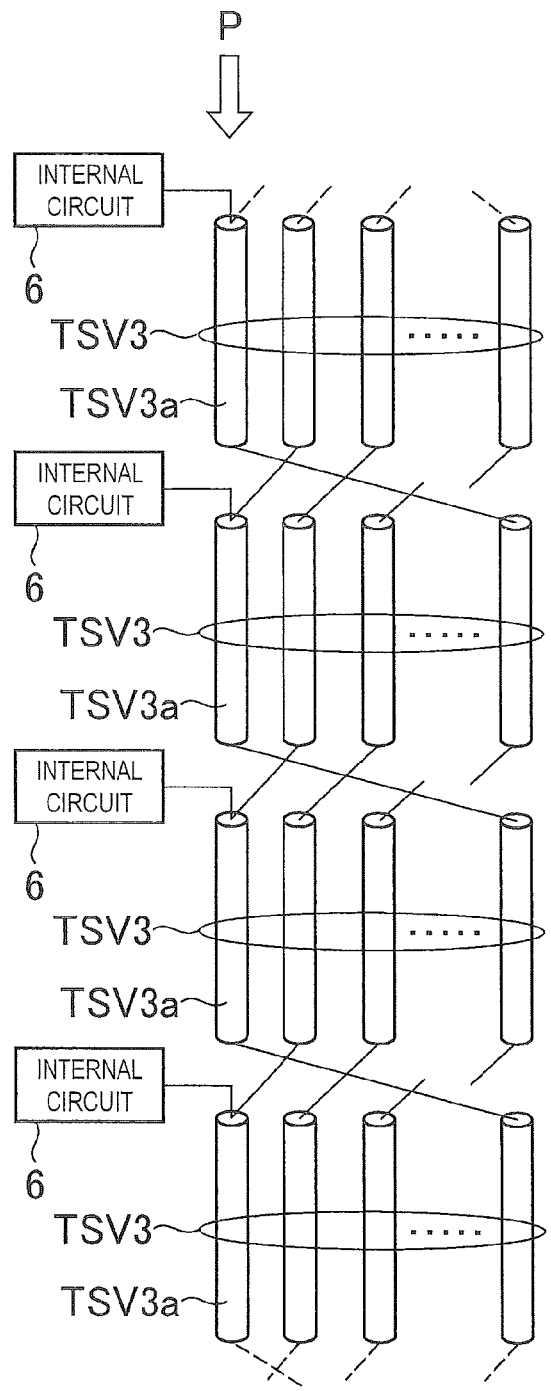

Another through silicon via TSV group is short-circuited from the through silicon vias TSV of other layer provided at the different position in plan view, as shown in FIG. 3C. With respect to this kind of through silicon via TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the Through silicon vias TSV provided in the core chips CC0 to CC7, three types (through silicon via TSV1 to through silicon via TSV3) shown in FIGS. 3A to 3C exist. As described above, most of the Through silicon vias TSV are of a type shown in FIG. 3A, and an address signal, a command signal, and a clock signal are supplied from the interface chip IF to the core chips CC0 to CC7, through the through silicon via TSV1 of the type shown in FIG. 3A. Read data and write data are input to and output from the interface chip IF through the through silicon via TSV1 of the type shown in FIG. 2A. Meanwhile, the through silicon via TSV2 and through silicon via TSV3 of the types shown in FIGS. 3B and 3C are used to provide individual information to the core chips CC0 to CC7 having the same structure.

Figure 4:
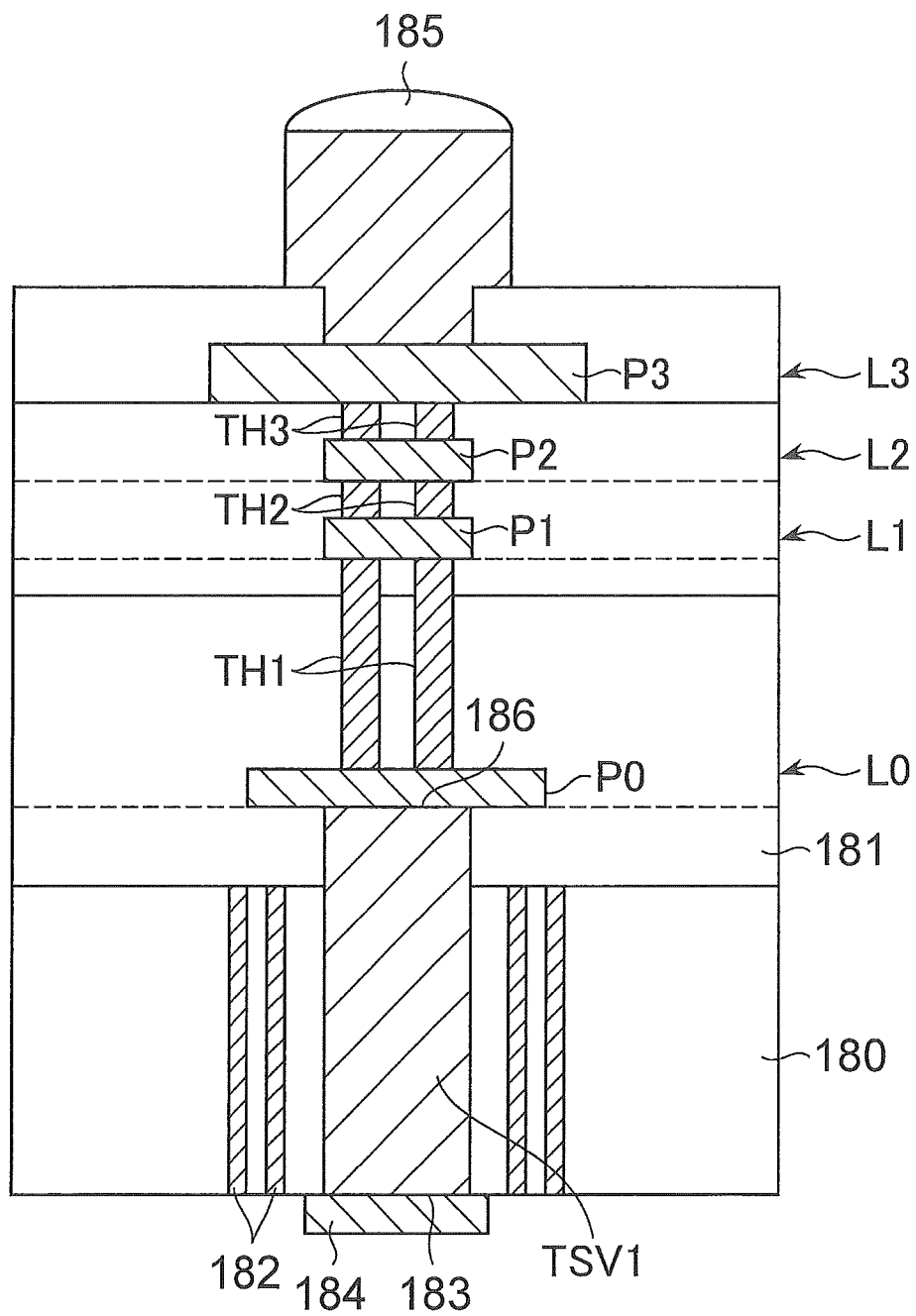
FIG. 4 is a cross-sectional view illustrating the structure of the through silicon via TSV of the type shown in FIG. 3A.

FIG. 4 is a cross-sectional view illustrating the structure of the through silicon via TSV1 of the type shown in FIG. 3A.

As shown in FIG. 4, the through silicon via TSV1 is provided to penetrate a silicon substrate 180 and an interlayer insulating film 181 provided on a surface of the silicon substrate 180. Around the through silicon via TSV1, an insulating ring 182 is provided. Thereby, the through silicon via TSV1 and a transistor region are insulated from each other. In an example shown in FIG. 4, the insulating ring 182 is provided double. Thereby, capacitance between the through silicon via TSV1 and the silicon substrate 180 is reduced.

An end 183 of the through silicon via TSV1 at the back surface of the silicon substrate 180 is covered by a back surface bump 184. The back surface bump 184 is an electrode that contacts a surface bump 185 provided in a core chip of a lower layer. The surface bump 185 is connected to an end 186 of the through silicon via TSV1, through plural pads P0 to P3 provided in wiring layers L0 to L3 and plural through-hole electrodes TH1 to TH3 connecting the pads to each other. Thereby, the surface bump 185 and the back surface bump 184 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 5:
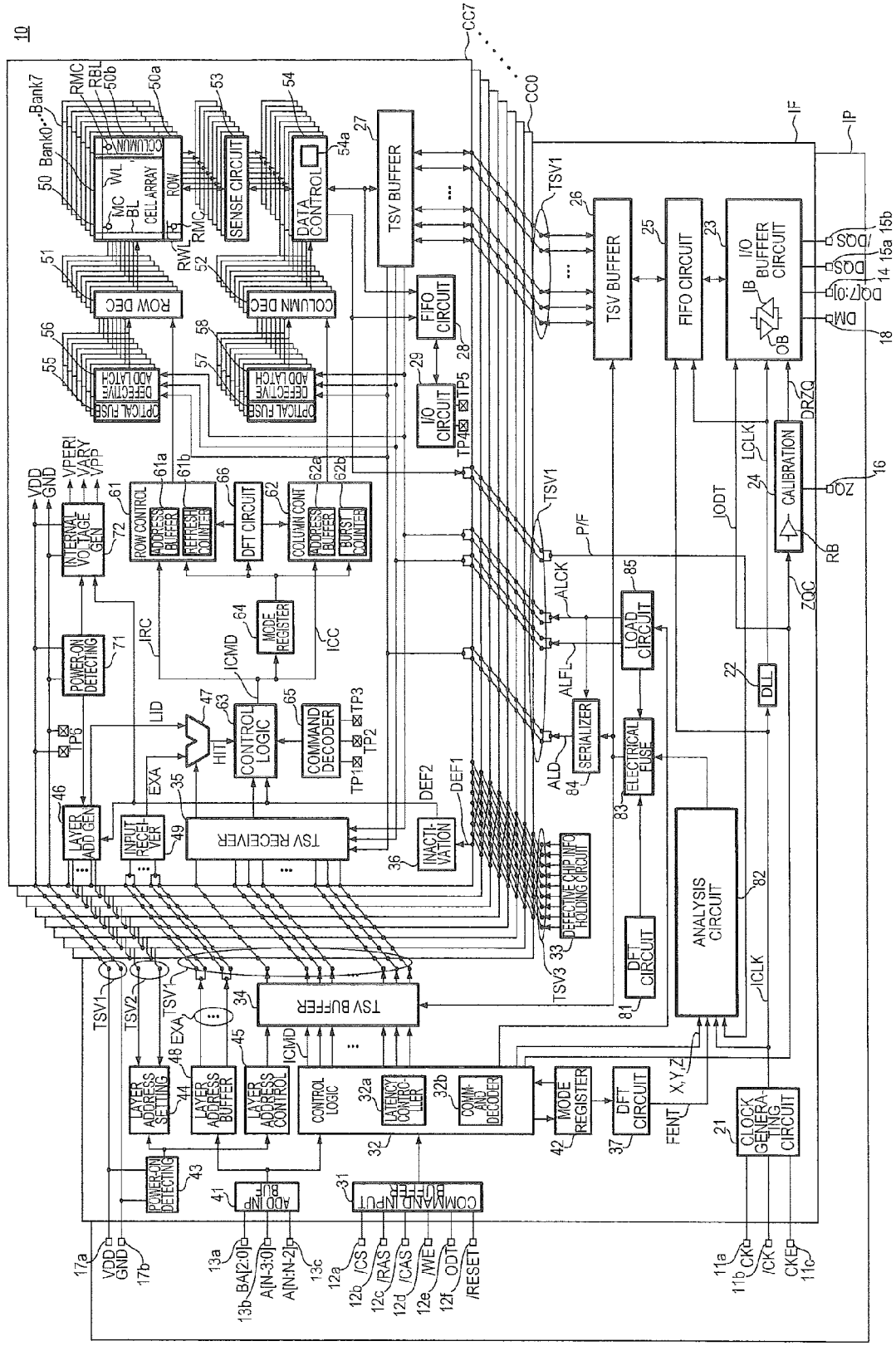
FIG. 5 is a block diagram illustrating the circuit configuration of the semiconductor device 10.

FIG. 5 is a block diagram illustrating the circuit configuration of the semiconductor device 10.

As shown in FIG. 5, the external terminals that are provided in the interposer IP include clock terminals 11a and 11b, an clock enable terminal 11c, command terminals 12a to 12f, an address terminal 13a to 13c, a data input/output terminal 14, data strobe terminals 15a and 15b, a calibration terminal 16, power supply terminals 17a and 17b, and a data mask terminal 18. All of the external terminals other than the power supply terminals 17a and 17b are connected to the interface chip IF and are not directly connected to the core chips CC0 to CC7.

First, a connection relationship between the external terminals and the interface chip IF and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor device 10 communicates with the external device. Accordingly, DLL function is not needed for the core chips CC0 to CC7 as the back end.

The command terminals 12a to 12f are supplied with a chip select signal /CS, a row-address strobe signal /RAS, a column address strobe signal /CAS, a write enable signal /WE, an on-die termination signal ODT, and a reset signal /RESET. These command signals are supplied to a command input buffer 31 that is provided in the interface chip IF. The command signals supplied to the command input buffer 31 are further supplied to a control logic 32. The control logic 32 includes a latency controller 32a and a command decoder 32b. The control logic 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through a TSV buffer 34 and the through silicon vias TSV.

The address terminal 13a is a terminal to which a bank address BA0 to BA2 is supplied. The address terminal 13b is a terminal to which an address signal A0 to A(N−3) is supplied. The address terminal 13C is a terminal to which an address signal AN to A(N−2) is supplied. The supplied address signals A0 to AN (A15) and BA0 to BA2 are supplied to an address input buffer 41 which is arranged in the interface chip IF. The output of the address input buffer 41 is supplied to the control logic 32 and a layer address buffer 48. The layer address buffer 48 functions to supply a layer address (layer information) EXA to the core chips CC0 to CC7 in common through the through silicon vias TSV. When in mode register setting, the address signal A0 to AN (A15) supplied to the control logic 32 is supplied to a mode register 42 which is arranged in the interface chip IF. The bank address BA0 to BA2 is decoded by the control logic 32, and the resulting bank select signal is supplied to a FIFO circuit 25. The reason is that bank selection on write data is performed inside the interface chip IF.

The data input/output terminal 14 is used to input/output read data or write data DQ0 to DQ7. The data strobe terminals 15a and 15b are terminals that are used to input/output strobe signals DQS and /DQS. The data mask terminal 18 is a terminal to which a data mask signal DM is supplied. The data input/output terminal 14, the data strobe terminals 15a and 15b, and the data mask terminal 18 are connected to the input/output buffer circuit 23 provided in the interface chip IF. The input/output buffer circuit 23 includes an input buffer IB and an output buffer OB, and inputs/outputs the read data or the write data DQ0 to DQ7 and the strobe signals DQS and /DQS in synchronization with the input/output clock signal LCLK supplied from the DLL circuit 22. If an internal on-die termination signal IODT is supplied from the control logic 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated.

The calibration circuit 24 includes a replica buffer RB that has the same circuit configuration as the output buffer OB. If the calibration signal ZQC is supplied from the control logic 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a FIFO circuit 25. The FIFO circuit 25 includes a FIFO circuit unit (not shown in the drawings) that realizes a FIFO function which operates by latency control realizing the well-known DDR function and a multiplexer (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the FIFO circuit 25 and the core chips CC0 to CC7 are connected in parallel. Parallel write data output from the FIFO circuit 25 is supplied to the core chips CC0 to CC7 through a TSV buffer 26. Parallel read data output from the core chips CC0 to CC7 is supplied to the FIFO circuit 25 through the TSV buffer 26. In this embodiment, each of the core chips CC0 to CC7 is the back end unit of the DDR3-type SDRAM and a prefetch number is 8 bits. The FIFO circuit 25 and each banks of the core chips CC0 to CC7 are connected respectively, and the number of banks that are included in each of the core chips CC0 to CC7 is 8. Accordingly, connection of the FIFO circuit 25 and the core chips CC0 to CC7 becomes 64 bits (8 bits×8 banks) for each DQ.

Parallel data, not converted into serial data, is basically transferred between the FIFO circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the FIFO circuit 25, a function for enabling a test in an interface chip unit is added. The interface chip does not have the back end unit. For this reason, the interface chip cannot be operated as a single chip in principle. However, if the interface chip IF never operates as the single chip, an operation test of the interface chip IF in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the FIFO circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 8 data input/output terminals 14. Thereby, a maximum I/O number can be set to 8 bits (DQ0 to DQ7). However, the I/O number is not fixed to 8 bits and, for example, may be set to 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the Through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 3B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 3C.

The interface chip IF further includes an electrical fuse circuit 83. The electrical fuse circuit 83 is a circuit that stores information that is needed to replace defects found after assembly with redundancy circuits. The information to be stored in the electrical fuse circuit 83 includes at least information on defects of the through silicon vias TSV and information on defects of the memory cells in the core chips CC0 to CC7. The TSV buffers 26 and 34 can replace the defective through silicon vias TSV with other through silicon vias TSV for repair. Since such repair is not directly related to the gist of the present invention, detailed description thereof will thus be omitted. The defective through silicon vias TSV are detected by using a DFT circuit 81, and programmed into the electrical fuse circuit 83.

The electrical fuse circuit 83 stores row addresses that represent word lines to be replaced or column addresses that represent bit lines to be replaced. Redundant word lines or redundant bit lines included in the corresponding core chips CC0 to CC7 are used as replacing redundant word lines or redundant bit lines.

The information stored in the electrical fuse circuit 83 includes information on defective addresses of memory cells, which is serially converted into serial data ALD by a serializer 84 before transferred to the core chips CC0 to CC7 via through silicon vias TSV. As shown in FIG. 5, defective addresses are transferred by using a plurality of through silicon vias TSV in parallel so as to avoid transfer defect due to defects of the through silicon vias TSV themselves. Other signals that use irreplaceable through silicon vias TSV, such as the layer address EXA and a determination signal P/F to be described later, also use a plurality of through silicon vias TSV in parallel.

The electrical fuse circuit 83 is programmed by an analysis circuit 82. The analysis circuit 82 is activated by a signal FENT which is the output of a DFT circuit 37. The analysis circuit 82 analyzes the pattern of occurrence of defective memory cells based on addresses supplied from the control logic 32 and the determination signal P/F supplied from the core chips CC0 to CC7. The analysis is intended to identify a pattern that allows most efficient replacement when replacing defective memory cells in units of word lines or bit lines. This means that the addresses stored in the electrical fuse circuit 83 are not in units of memory cells but in units of word lines or bit lines. The replacement in units of word lines or bit lines is performed during manufacturing when the core chips CC0 to CC7 are in a wafer state. The electrical fuse circuit 83 uses redundant word lines or bit lines that remain unused by the replacement in the wafer state. The analysis circuit 82 is thus a fail memory repair analyzer.

The information programmed in the electrical fuse circuit 83 is read by using a load circuit 85. The load circuit 85 reads the information programmed in the electrical fuse circuit 83 and generates timing signals ALFL and ALCK, thereby functioning to synchronize the serializer 84 with the core chips CC0 to CC7.

The above description is the outline of the connection relationship between the external terminals and the interface chip IF and the circuit configuration of the interface chip IF. Next, the circuit configuration of the core chips CC0 to CC7 will be described.

As shown in FIG. 5, memory cell arrays 50 that are included in the core chips CC0 to CC7 having the back end function are divided into eight banks. A bank is a unit that can individually receive a command. That is, the individual banks can be independently and nonexclusively controlled. From the outside of the semiconductor device 10 (an outside controller which controls the semiconductor device 10), each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 5, only one word line WL, one bit line BL, and one memory cell MC are shown).

The memory cell array 50 includes a row redundancy array 50a and a column redundancy array 50b. The row redundancy array 50a includes redundant cells RMC that are connected to a plurality of redundant word lines RWL. The column redundancy array 50b includes redundant cells RMC that are connected to a plurality of redundant bit lines RBL. The row redundancy array 50a is accessed as an alternative if an access-requested memory cell belongs to a defective word line. The column redundancy array 50b is accessed as an alternative if an access-requested memory cell belongs to a defective bit line. Such alternative accesses are made when an access is requested to the addresses that are stored in the foregoing electrical fuse circuit 83 or optical fuse circuits 55 and 57 to be described later.

The word lines WL are selected by a row decoder 51. The bit lines BL are connected to corresponding sense amplifiers SA in a sense circuit 53. The sense amplifiers SA are selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1 through a TSV receiver 35 and a control logic circuit 63. The row control circuit 61 also includes a refresh counter 61b. When an internal refresh command is issued by the control logic circuit 63, a row address that is indicated by the refresh counter 61b is supplied to the row decoder 51.

The row decoder 51 includes a not-shown address comparison circuit, which compares the row address supplied from the row control circuit 61 with addresses retained in a defective address latch circuit 56. The defective address latch circuit 56 is a circuit that latches defective row addresses read from the optical fuse circuit 55. The defective address latch circuit 56 includes a circuit that latches the defective row addresses read from the optical fuse circuit 55, as well as a circuit that latches defective row addresses read from the electrical fuse circuit 83. If the comparison by the row decoder 51 shows a match of the addresses, a redundant word line included in the row redundancy array 50a is accessed instead of the word line that is designated by the row address. If the addresses do not match, the word line designated by the row address is simply accessed.

The optical fuse circuit 55 includes a plurality of fuse sets. The fuse sets correspond to the respective plurality of redundant word lines in the row redundancy array 50a. That is, if a fuse set is programmed with a row address and an access to that row address is requested, then the redundant word line associated with that fuse set is accessed. Some of the fuse sets included in the optical fuse circuit 55 correspond to those included in the electrical fuse circuit 83 on a one-to-one basis. Consequently, redundant word lines that are specified as replacing word lines by some of the fuse sets included in the optical fuse circuit 55 can also be specified as replacing word lines by fuse sets included in the electrical fuse circuit 83. However, the optical fuse circuit 55 and the electrical fuse circuit 83 will not conflict with each other. A redundant word line is used as a replacing word line by either one of a fuse set included in the optical fuse circuit 55 and a fuse set included in the electrical fuse circuit 83.

The column decoder 52 is controlled by a column address supplied from a column control circuit 62. The column control circuit 62 includes an address buffer 62a that receives a column address supplied from the interface chip IF through the through silicon vias TSV. The column address buffered in the address buffer 62a is supplied to the column decoder 52. The column control circuit 62 also includes a burst counter 62b that counts the burst length.

The column decoder 52 includes a not-shown address comparison circuit, which compares the column address supplied from the column control circuit 62 with addresses retained in a defective address latch circuit 58. The defective address latch circuit 58 is a circuit that latches defective column addresses read from the optical fuse circuit 57. The defective address latch circuit 58 includes a circuit that latches the defective column addresses read from the optical fuse circuit 57, as well as a circuit that latches defective column addresses read from the electrical fuse circuit 83. If the comparison by a column decoder 52 shows a match of the addresses, a redundant bit line included in the column redundancy array 50b is accessed instead of the bit line that is designated by the column address. If the addresses do not match, the bit line designated by the column address is simply accessed. The bit lines are accessed by selecting the corresponding sense amplifiers SA in the sense circuit 53.

The optical fuse circuit 57 includes a plurality of fuse sets. The fuse sets correspond to the respective plurality of redundant bit lines in the column redundancy array 50b. That is, if a fuse set is programmed with a column address and an access to that column address is requested, then the redundant bit line associated with that fuse set is accessed. Some of the fuse sets included in the optical fuse circuit 57 correspond to those included in the electrical fuse circuit 83 on a one-to-one basis. Consequently, redundant bit lines that are specified as replacing bit lines by some of the fuse sets included in the optical fuse circuit 57 can also be specified as replacing bit lines by fuse sets included in the electrical fuse circuit 83. Note that the optical fuse circuit 57 and the electrical fuse circuit 83 will not conflict with each other. A redundant bit line is used as a replacing bit line by either one of a fuse set included in the optical fuse circuit 57 and a fuse set included in the electrical fuse circuit 83.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through a TSV buffer 27 and the through silicon via TSV. The data control circuit 54 includes a test circuit 54a. The test circuit 54a makes a pass-fail determination in a test operation, and outputs the result of the pass-fail determination as a determination signal P/F.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing the layer address EXA which is a part of the address signal supplied from the interface chip IF through the through silicon via TSV and a layer address LID (chip identification information) set to the layer address generating circuit 46. The layer address EXA supplied from the interface chip IF is input to the core chips CC0 to CC7 through respective input receivers 49.

In the layer address generating circuit 46, unique layer addresses are set to the core chips CC0 to CC7, respectively, at initialization. A method of setting the layer addresses is as follows. First, after the semiconductor device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 3B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is supplied with a defective chip signal DEF2 from an inactivation circuit 36. The inactivation circuit 36 is a circuit that is activated when a defective chip signal DEF1 is supplied from the defective chip information holding circuit 33 of the interface chip IF through the through silicon vias TSV. As the defective chip signal DEF1 is supplied to the individual core chips CC0 to CC7 using the through silicon via TSV3 of the type shown in FIG. 3C, the defective chip signals DEF1 can be supplied to the core chips CC0 to CC7, individually. The defective chip signal DEF1 is activated when the corresponding core chip is a defective chip. When the defective chip signal DEF1 is activated, the layer address generating circuit 46 transmits, to the core chip of the lower layer, a non-incremented layer address, not an incremented layer address. The defective chip signal DEF2 is also supplied to the control logic circuit 63. When the defective chip signal DEF2 is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 72. The internal voltage generating circuit 72 is provided with power supply potentials VDD and VSS. The internal voltage generating circuit 72 receives these power supply potentials and generates various internal voltages. As the internal voltages that are generated by the internal voltage generating circuit 72, an internal voltage. VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 29 and a test FIFO circuit 28 are also provided in each of the core chips CC0 to CC7. At testing, a DFT circuit 66 is used which is included in each of the core chips CC0 to CC7.

This is the entire configuration of the semiconductor device 10. Because in the semiconductor device 10, the 8 core chips of 1 Gb are laminated, the semiconductor device 10 has a memory capacity of 8 Gb in total. Because the chip select signal /CS is input to one terminal (chip select terminal), the semiconductor memory device is recognized as a single DRAM having the memory capacity of 8 Gb, in view of the controller. However, a memory capacity of the core chip is not restricted in particular.

Next, a method of replacing defective cells included in the core chips CC0 to CC7 will be described.

The replacement of defective cells is performed twice in the process of manufacturing the semiconductor device 10. The first replacement is performed in a wafer process, and the second an assembly process. The replacement in the wafer process is performed by using the optical fuses 55 and 57 in order to repair defects that occur in the wafer process. The replacement in the assembly process is performed by using the electrical fuse circuit 83 in order to repair defects that occur in the assembly process. In other words, the replacement in the wafer process stores defective addresses into the core chips CC0 to CC7 themselves. The replacement in the assembly process stores defective addresses into the interface chip IF.

Figure 6:
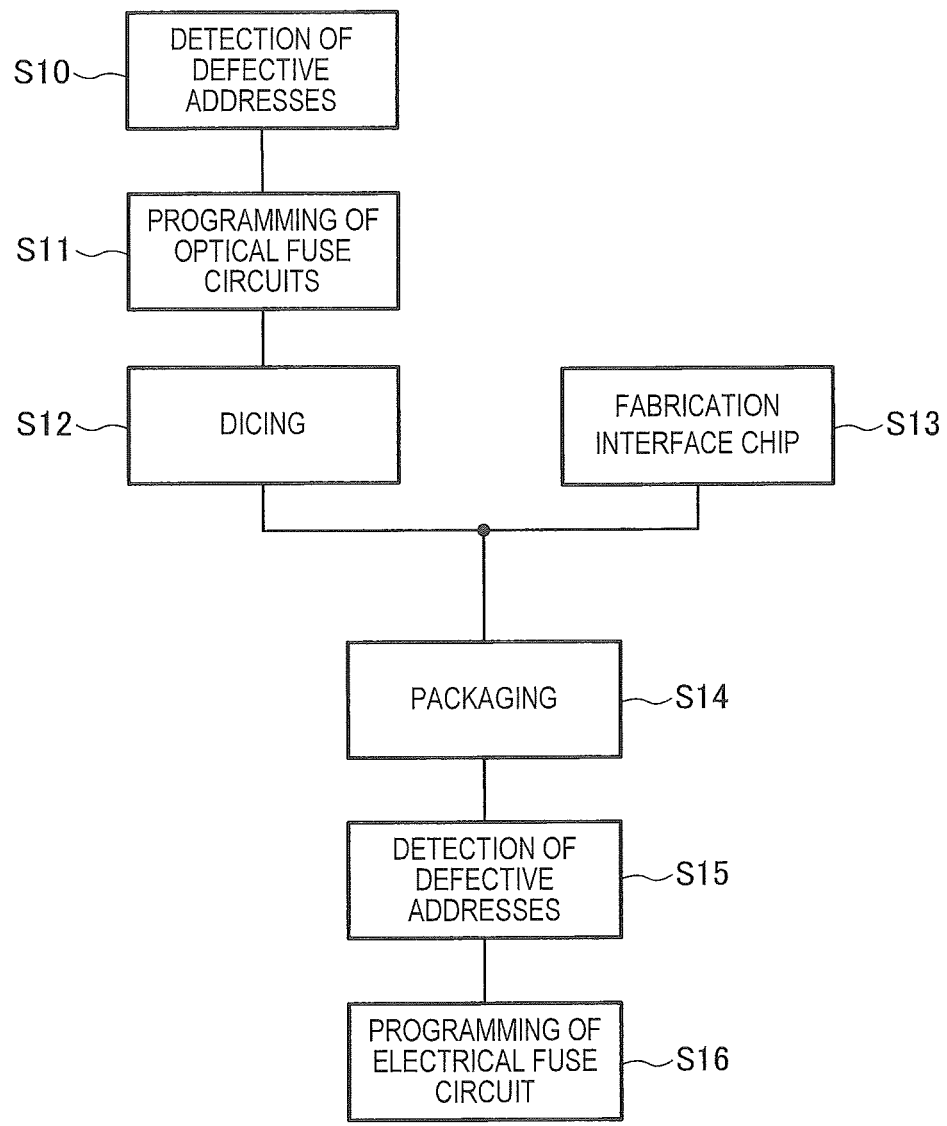
FIG. 6 is a flowchart for explaining the method of replacing defective cells included in the core chips CC0 to CC7.

FIG. 6 is a flowchart for explaining the method of replacing defective cells included in the core chips CC0 to CC7.

At first, the core chips CC0 to CC7 in a wafer state are subjected to an operation test to detect defective addresses (step S10). The defective addresses detected are analyzed in a tester outside the semiconductor device 10, whereby replacement data is determined. The replacement data refers to information that identifies the word lines or bit lines to be replaced and the word lines or bit lines to replace. The word lines or bit lines to be replaced are identified by row addresses or column addresses. The word lines or bit lines to replace are identified by the addresses of fuse sets to be used in the optical fuse circuits 55 and 57.

Next, the optical fuse circuits 55 and 57 are programmed based on the replacement data (step S11). Specifically, laser beam irradiation is performed by using a laser trimmer, whereby predetermined fuse sets included in the optical fuse circuits 55 and 57 are programmed with row addresses that represent the word lines to be replaced or column addresses that represent the bit lines to be replaced. The completion of the replacement operation in the wafer process is followed by wafer singulation (step S12). Meanwhile, the electrical fuse circuit 83 in the interface chip IF is fabricated in a step separate from the setting steps of the core chips CC0 to CC7 (step S13).

Next, the separated pieces of the core chips CC0 to CC7 and the interface chip IF are stacked on each other and packaged as shown in FIG. 6 (step S14). After the packaging, the second operation test is performed to detect defective addresses (step S15). The first operation test performed in the wafer state and the replacement of defective cells based on the operation test ensure that all the addresses of the core chips CC0 to CC7 to be stacked are normally accessible. However, new defective addresses may occur due to load during packaging and the load of a burn-in test. The second operation test is performed to detect and repair such new defective addresses that occur after the end of the first operation test.

Next, the electrical fuse circuit 83 is programmed based on the defective addresses detected (step S16). Specifically, an electrical fuse controller (to be described later) included in the electrical fuse circuit 83 is used to apply a high voltage, whereby the fuse sets included in the electrical fuse circuit 83 are programmed with row addresses that represent the word lines to be replaced or column addresses that represent the bit lines to be replaced. This completes the series of replacement operations, and the semiconductor device 10 is shipped as a confirming product.

Figure 7:
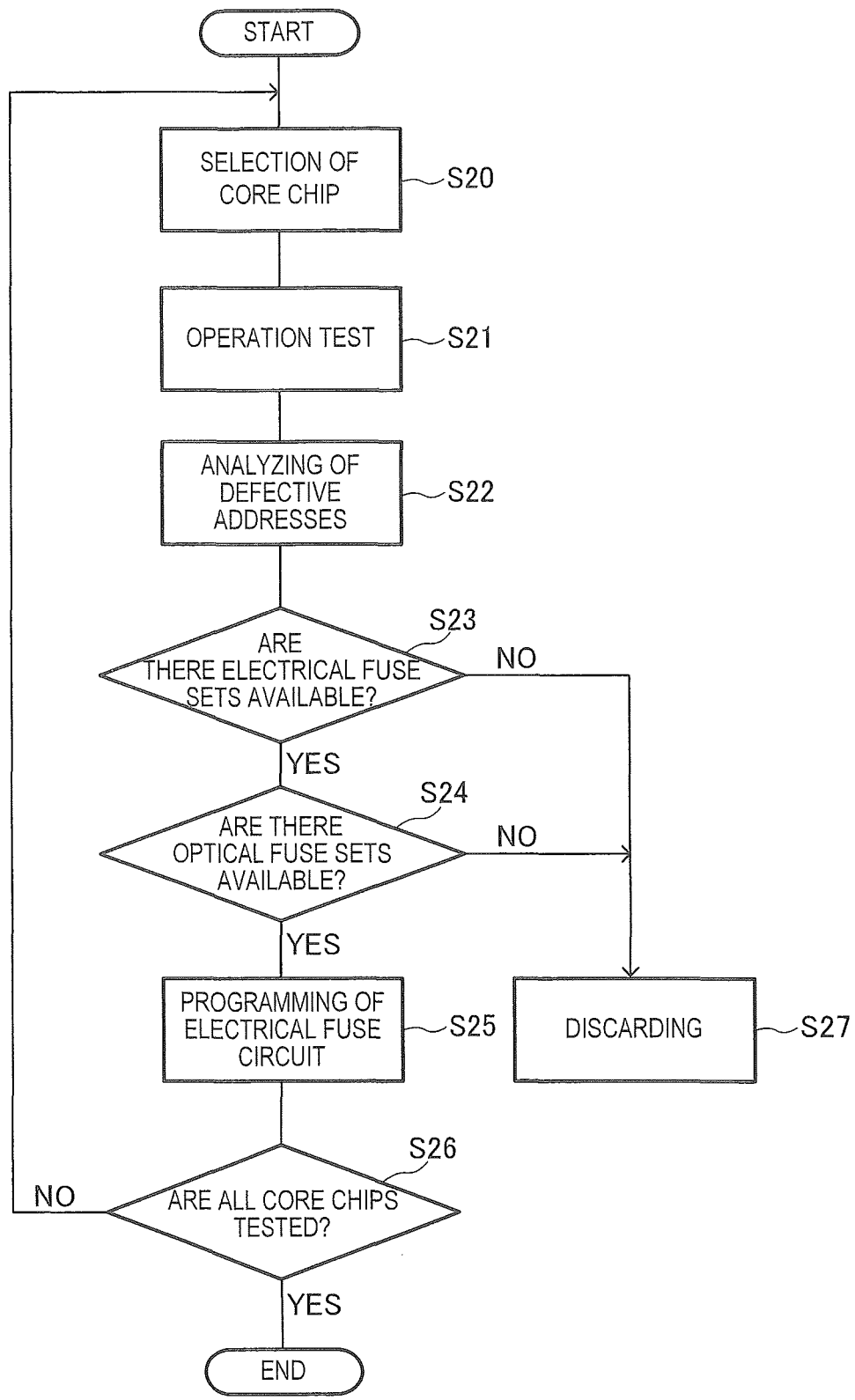
FIG. 7 is a flowchart for explaining operations of steps S15 and S16 shown in FIG. 6 in more detail.

FIG. 7 is a flowchart for explaining the operation of steps S15 and 16 shown in FIG. 6 in more detail.

At first, one of the core chips CC0 to CC7 is selected (step S20), and an operation test is performed thereon (step S21). In the operation test, the data control circuit 54 (test circuit 54a) in that core chip CC0 to CC7 makes pass-fail determinations. The resulting determination signal P/F is transferred to the analysis circuit 82 in the interface chip IF through the through silicon vias TSV1, and analyzed by the analysis circuit 82 (step S22). The analysis circuit 82 analyzes the defective addresses to generate replacement data so that all the defective cells found can be replaced with a smaller number of redundant word lines or redundant bit lines. The replacement data includes information on replacing word lines or bit lines, which are identified in terms of the addresses of fuse sets to be used in the electrical fuse circuit 83.

If the analysis shows that the replacement is not possible even by using all the fuse sets (step S23: NO), the semiconductor device 10 is handled as a defective product (step S27). Even if the replacement is possible by using fuse sets in the electrical fuse circuit 83, the semiconductor device 10 may also be handled as a defective product (step S27) when the fuse sets to be used in the electrical fuse circuit 83 are already assigned to the used fuse sets in the optical fuse circuits 55 and 57 (step S24: NO). If neither is the case, predetermined fuse sets in the electrical fuse circuit 83 are programmed with row addresses that represent the word lines to be replaced or column addresses that represent the bit lines to be replaced (step S25). As a result, new defective addresses occurring in the core chip are repaired.

Such an operation is performed on all the core chips CC0 to CC7 in order. If the foregoing operation is completed on all the core chips CC0 to CC7 (step S26: YES), the series of replacement operations are completed and the semiconductor device 10 is shipped as a conforming product.

Figure 8:
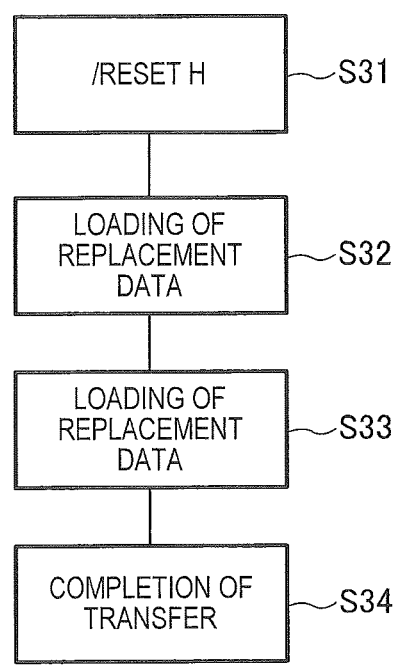
FIG. 8 is a flowchart for explaining an operation of loading replacement data programmed in an electrical fuse circuit 83.

FIG. 8 is a flowchart for explaining the operation of loading the replacement data programmed in the electrical fuse circuit 83.

The operation of loading the replacement data is performed in response to when the reset signal /RESET supplied to the command terminal 12f changes to a high level (step S31). When the reset signal /RESET changes to the high level, the load circuit 85 included in the interface chip IF is activated to read the replacement data programmed in the electrical fuse circuit 83 (step S32). The replacement data read from the electrical fuse circuit 83 is serial-converted by the serializer 84, and transferred to each of the core chips CC0 to CC7 through the through silicon vias TSV1 (step S33). When the serializer 84 transfers the replacement data, the layer address buffer 48 simultaneously transfers a layer address EXA. The replacement data, which is supplied in common to the core chips CC0 to CC7, is thereby enabled only for the core chip that is designated by the layer address EXA. The replacement data is latched into the defective address latch circuits 56 and 58 included in that core chip. When all the pieces of replacement data are transferred to the respective corresponding core chips CC0 to CC7, the series of transfer operations are completed (step S34).

Figure 9:
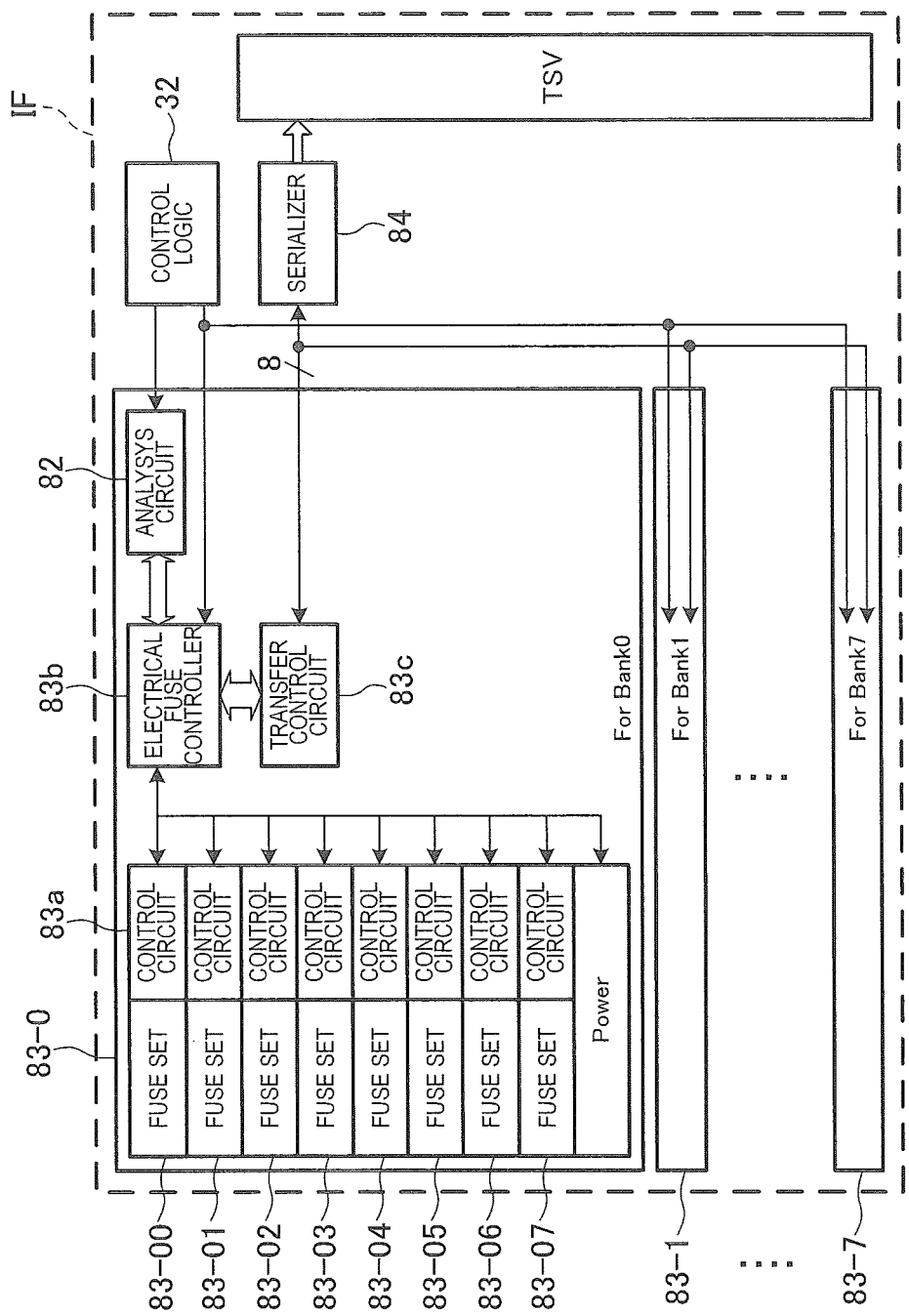
FIG. 9 is a block diagram showing a configuration of the electrical fuse circuit 83 in more detail.

FIG. 9 is a block diagram showing the configuration of the electrical fuse circuit 83 in more detail.

As shown in FIG. 9, the electrical fuse circuit 83 is provided for each bank. Since the present embodiment has an 8-bank configuration, the electrical fuse circuit 83 is divided into eight electrical fuse circuits 83-0 to 83-7, which correspond to bank 0 to bank 7, respectively. The electrical fuse circuits 83-0 to 83-7 have the same circuit configuration. FIG. 9 representatively shows only the circuit configuration of the electrical fuse circuit 83-0.

The electrical fuse circuit 83-0 includes a plurality of fuse sets 83-00 to 83-07 which are allocated to the core chips CC0 to CC7, respectively. The fuse sets 83-00 to 83-07 each include a plurality of fuse sets intended for row addresses and column addresses. The fuse sets are provided with respective corresponding control circuits 83a, which read and write the fuse sets under the control of an electrical fuse controller 83b. Data to be written to the fuse sets and data read from the fuse sets are transmitted and received through a transfer control circuit 83c.

Each fuse set includes a plurality of electrical fuses. Electrical fuses are electrically-writable memory elements, preferably a nonvolatile and irreversible one-time ROM. For a one-time ROM, it is preferred to use antifuse elements in which data is stored in terms of the presence or absence of a dielectric breakdown (breakdown of an insulating film) due to application of a high voltage.

The data read through the transfer control circuit 83c is serial-converted by the serializer 84 before transferred to the core chips CC0 to CC7 through the through silicon vias TSV. The data to be written to the electrical fuse circuit 83 is supplied from the control logic 32 and the analysis circuit 82, and programmed into predetermined fuse sets under the control of the electrical fuse controller 83b. The electrical fuse controller 83b thus functions as a programming circuit that programs the electrical fuse sets.

Figure 10:
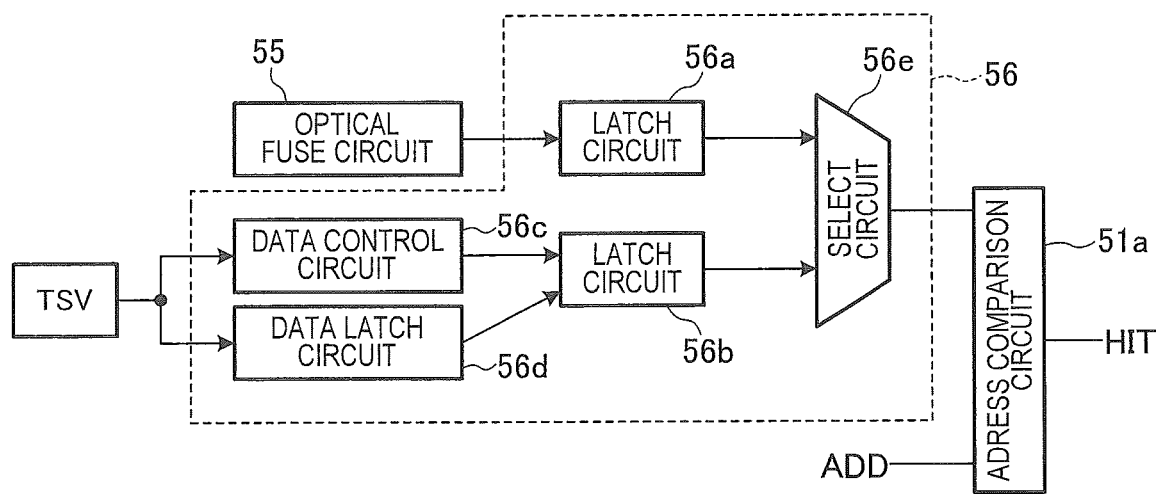
FIG. 10 is a block diagram showing a configuration of a defective address latch circuit 56 in more detail.

FIG. 10 is a block diagram showing the configuration of the defective address latch circuit 56 in more detail.

As shown in FIG. 10, the defective address latch circuit 56 includes a latch circuit 56a that latches replacement data read from an optical fuse circuit 55, and a latch circuit 56b that latches replacement data read from the electrical fuse circuit 83. A data control circuit 56c and a data latch circuit 56d are arranged in the stage prior to the latch circuit 56b. Under the control of the circuits 56c and 56d, the replacement data transferred from the interface chip IF through the through silicon vias TSV is latched into the latch circuit 56b.

The output of the latch circuit 56a and the output of the latch circuit 56b are supplied to a select circuit 56e. The select circuit 56e is a circuit that selects either one of the outputs of the latch circuit 56a and the latch circuit 56b. The replacement data selected is supplied to a row decoder 51. The select circuit 56e makes the selection based on flag information to be described later. The row decoder 51 includes an address comparison circuit 51a, which compares the replacement data selected by the select circuit 56e with an access-requested row address. If the two match, a redundant word line included in a row redundancy array 50a is accessed instead of the word line that is designated by the row address. If the addresses do not match, the word line designated by the row address is simply accessed.

The defective address latch circuit 58 on the column side has the same circuit configuration as that of the defective address latch circuit 56 described above. Redundant description will thus be omitted.

Figure 11:
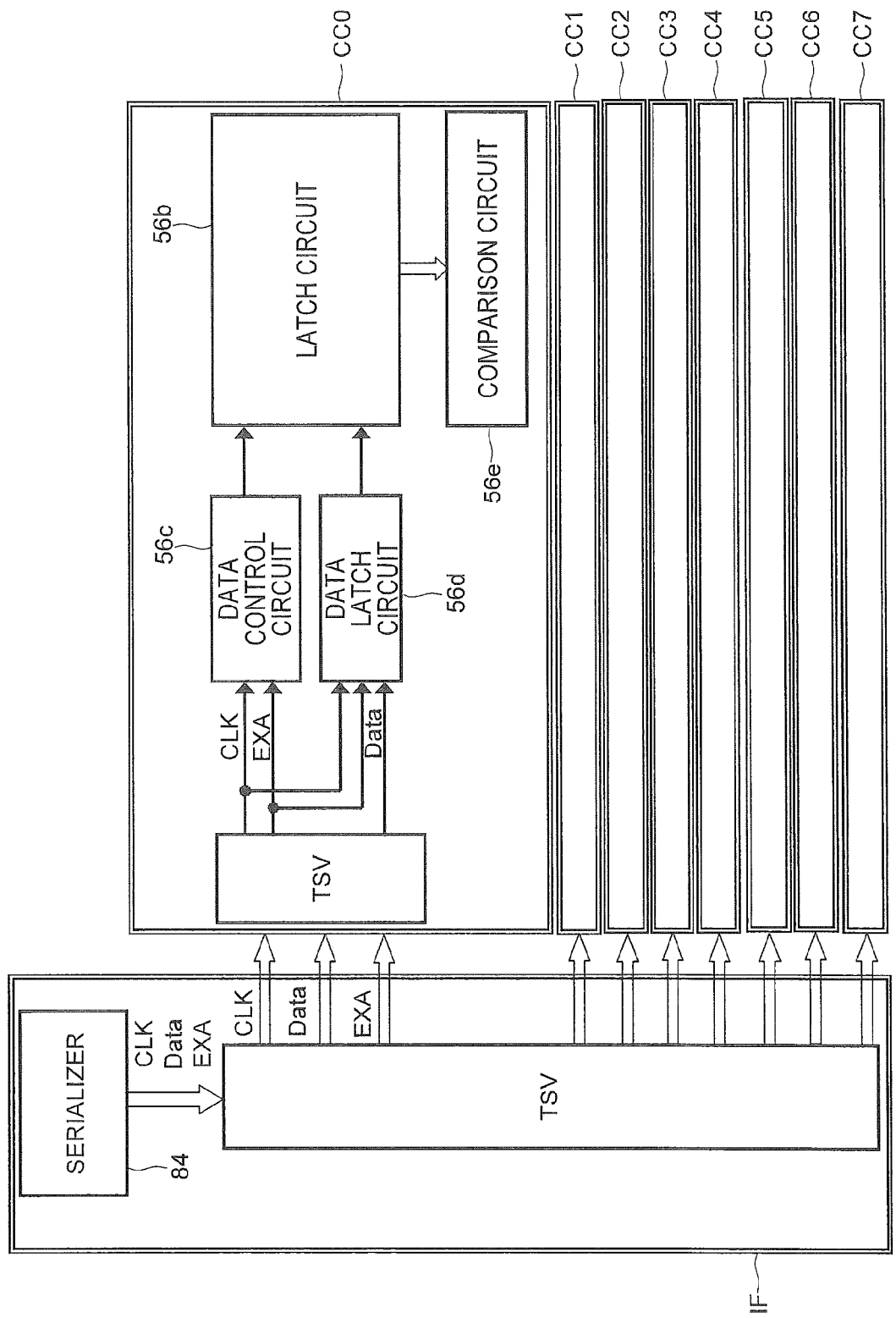
FIG. 11 is another block diagram showing the configuration of the defective address latch circuit 56 in more detail.

As mentioned above, the replacement data transferred from the interface chip IF is supplied in common to the core chips CC0 to CC7. The core chips CC0 to CC7 therefore need the layer address EXA in order to determine whether or not to accept the transferred replacement data. For that purpose, as shown in FIG. 11, the replacement data and the layer address EXA are simultaneously transferred to the core chips CC0 to CC7. The replacement data supplied in common to the core chips CC0 to CC7 is thereby enabled only for the core chip that is designated by the layer address EXA. More specifically, the data control circuit 56c and the data latch circuit 56d are activated to perform the processing of writing the transferred replacement data into the latch circuit 56b only when the layer address EXA matches the layer address LID unique to each core chip CC0 to CC7. The series of transfer operations are performed in synchronization with the internal clock signal ICLK which is generated in the interface chip IF.

Figure 12:
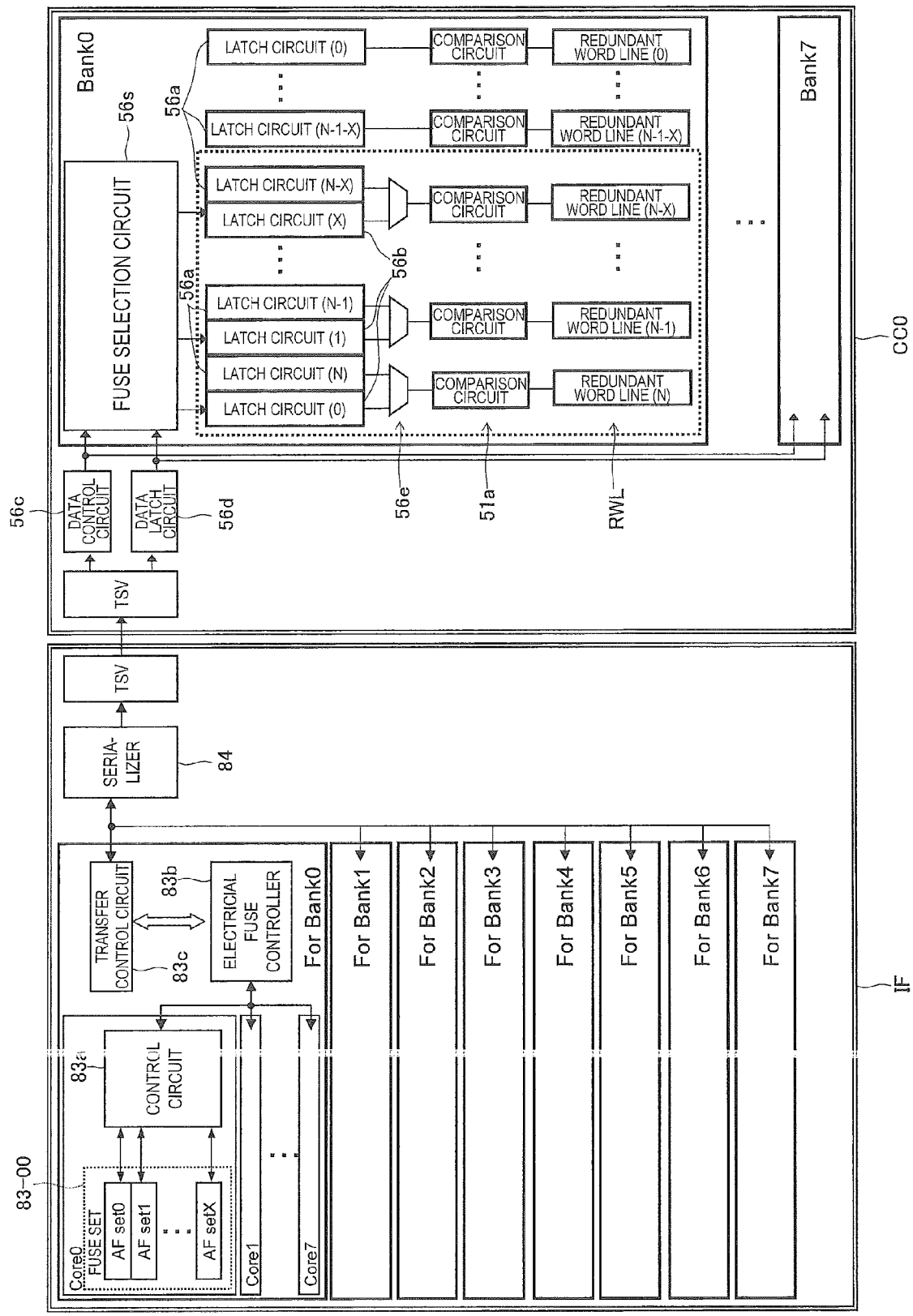
FIG. 12 is a block diagram showing the configuration of the electrical fuse circuit 83 and the defective address latch circuit 56 in more detail.

FIG. 12 is a block diagram showing the configuration of the electrical fuse circuit 83 and the defective address latch circuit 56 in more detail.

As has been described, the electrical fuse circuit 83 is divided into the electrical fuse circuits 83-0 to 83-7 by bank. The electrical fuse circuits 83-0 to 83-7 each include a plurality of fuse sets 83-00 to 83-07 which are allocated to the core chips CC0 to CC7, respectively. As shown in FIG. 12, the electrical fuse set 83-00 includes (X+1) fuse sets, whereby (X+1) row addresses (or column addresses) can be stored.

As shown in FIG. 12, each defective address latch circuit 56 includes (N+1) latch circuits 56a and (X+1) latch circuits 56b. The (N+1) latch circuits 56a correspond to zeroth to Nth optical fuse sets, respectively. Of these, the latch circuits 56a corresponding to the zeroth to (N−1−X)th optical fuse sets have no latch circuit 56b to be paired with, and thus have no corresponding select circuit 56e.

On the other hand, the latch circuits 56a corresponding to the (N−X)th to Nth optical fuse sets have latch circuits 56b to be paired with. Specifically, the latch circuits 56b corresponding to the Xth to zeroth electrical fuse sets are allocated to the (N−X)th to Nth optical fuse sets, respectively. Select circuits 56e are provided for such latch circuits 56a and 56b, so that the outputs of either ones of the latch circuits 56a and 56b are selected. Replacement data transferred from the interface chip IF is latched into specified latch circuits 56b under the control of a fuse select circuit 56s.

The outputs of the latch circuits 56a and 56b are supplied to the address comparison circuits 51a. If an output matches an access-request address, the corresponding redundant word line RWL is accessed.

Figure 13:
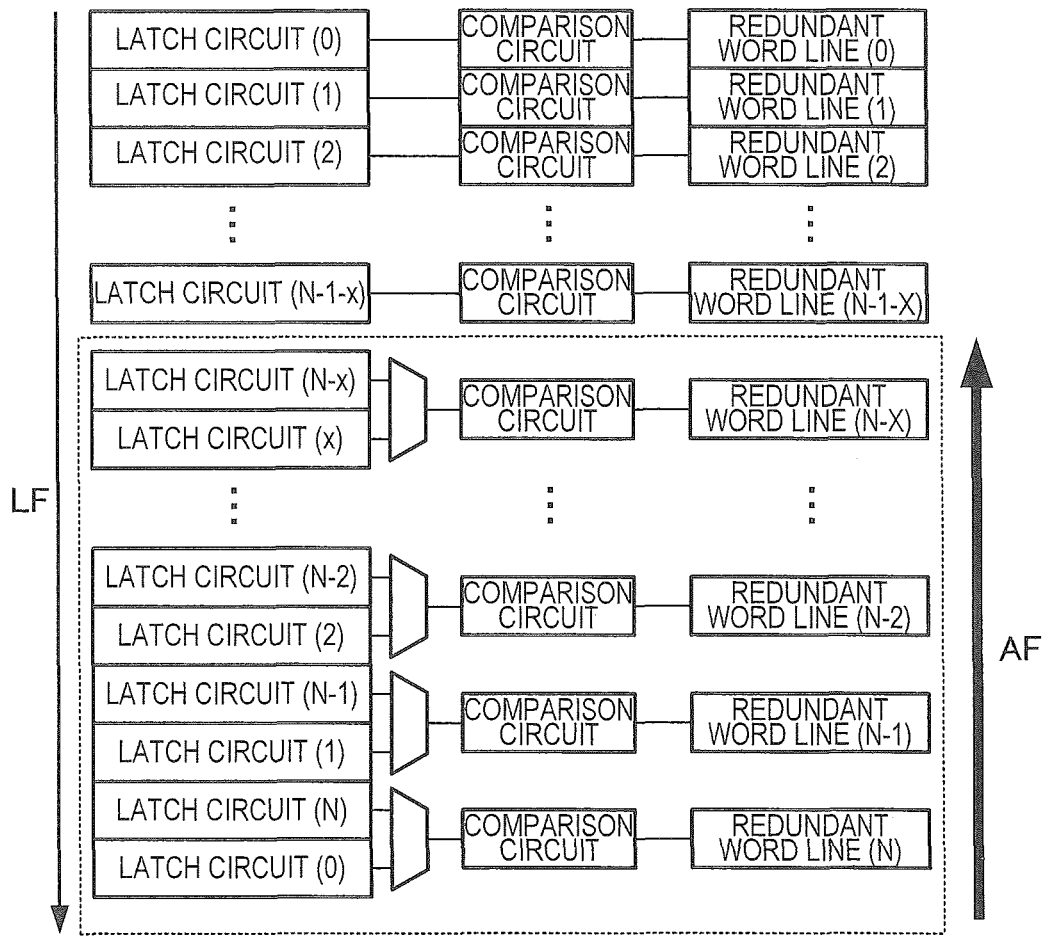
FIG. 13 is a diagram for explaining a relationship between order of selection of optical fuse circuits 55 and order of selection of the electrical fuse circuit 83.

FIG. 13 is a diagram for explaining the relationship between the order of selection of the optical fuse circuits 55 and the order of selection of the electrical fuse circuit 83.

As has been described, the optical fuse circuits 55 are programmed in step S11 shown in FIG. 6. The electrical fuse circuit 83 is programmed in step S16 shown in FIG. 6. That is, the optical fuse circuits 55 are programmed first, and fuse sets remaining unused in step S11 are used by the electrical fuse circuit 83 for alternative use. In such a configuration, no conflict is allowed between the redundant word lines that are selected by the optical fuse circuits 55 and the redundant word lines that are selected by the electrical fuse circuit 83. In order to avoid such a conflict and in order for the electrical fuse circuit 83 to use the remaining fuse sets for alternative use more efficiently, the present embodiment is configured so that, as shown in FIG. 13, the optical fuse circuits 55 are programmed by using the optical fuse sets from the zeroth in succession (arrow LF). On the other hand, the electrical fuse circuit 83 is programmed by using the electrical fuse sets from the zeroth, which is paired with the Nth optical fuse set, in succession (arrow AF). This makes it possible for the electrical fuse circuit 83 to efficiently use the remaining fuse sets for alternative use.

Figure 14:
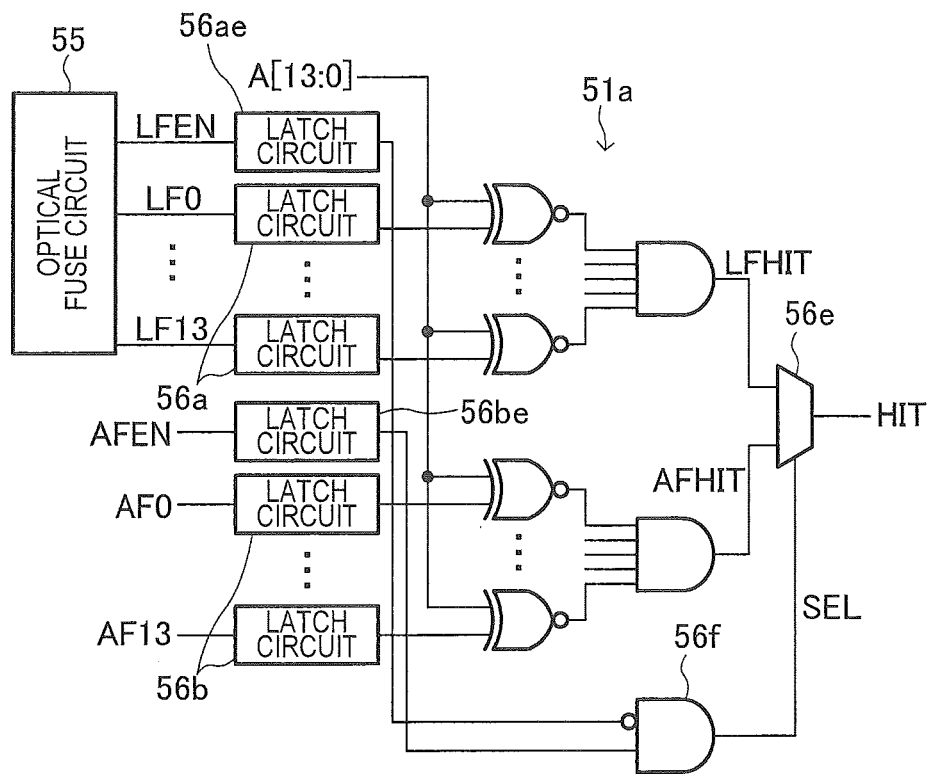
FIG. 14 is a circuit diagram showing an example of an address comparison circuit 51a and a select circuit 56e.

FIG. 14 is a circuit diagram showing an example of the address comparison circuit 51a and the select circuit 56e. The circuit example shown in FIG. 14 is suitably applied to the row side.

The example shown in FIG. 14 includes 14 latch circuits 56a and 14 latch circuits 56b which correspond to the bits A0 to A13 of a row address, respectively. The outputs of the latch circuits are compared with the respective corresponding bits of the row address by the EXNOR circuits. The outputs of the EXNOR circuits corresponding to the latch circuits 56a are collected by an AND gate circuit and output as an optical fuse hit signal LFHIT. Similarly, the outputs of the EXNOR circuits corresponding to the latch circuits 56b are collected by an AND gate circuit and output as an electrical fuse hit signal AFHIT.

The optical fuse hit signal LFHIT and the electrical fuse hit signal AFHIT are supplied to the select circuit 56e, and either one of the signals is selected by a select signal SEL. The signal selected is output as a redundancy determination signal HIT. The select signal SEL is generated by an AND gate circuit 56f. The AND gate circuit 56f is supplied with the output of a latch circuit 56ae that latches an optical fuse enable signal LFEN, and the output of a latch circuit 56be that latches an electrical fuse enable signal AFEN. The electrical fuse enable signal AFEN corresponds to the first flag information FL1 shown in FIG. 1, and indicates whether the corresponding electrical fuse set is enabled or not, i.e., whether used or not. The optical fuse enable signal LFEN corresponds to the second flag information FL2 shown in FIG. 1, and indicates whether the corresponding optical fuse set is enabled or not, i.e., whether used or not.

The optical fuse enable signal LFEN turns to a high level when the optical fuse set is used. The electrical fuse enable signal AFEN turns to a high level when the electrical fuse set is used. Consequently, when the optical fuse set is in use, the select signal SEL remains at a low level. In such a case, the select circuit 56e selects the optical fuse hit signal LFHIT. On the other hand, when the optical fuse set is not in use and the electrical fuse set is in use, the select signal SEL turns to a high level and the select circuit 56e selects the electrical fuse hit signal AFHIT.

Figure 15:
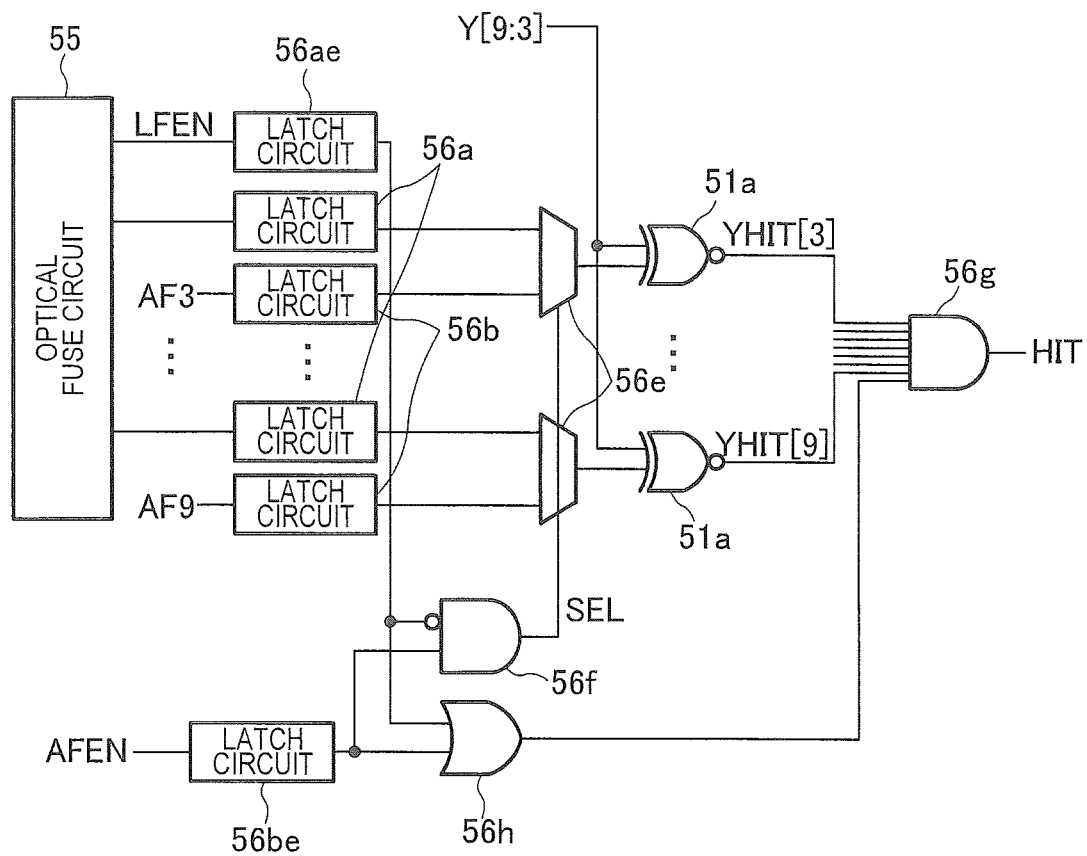
FIG. 15 is a circuit diagram showing another example of the address comparison circuit 51a and the select circuit 56e.

FIG. 15 is a circuit diagram showing another example of the address comparison circuit 51a and the select circuit 56e. The circuit example shown in FIG. 15 is suitably applied to the column side.

The example shown in FIG. 15 includes seven latch circuits 56a and seven latch circuits 56b which correspond to the bits Y3 to Y9 of a column address, respectively. Unlike the circuit example shown in FIG. 14, the select circuit 56e is provided for each bit. The outputs of the seven select circuits 56e are compared with the respective corresponding bits by the EXNOR circuits. The outputs of the EXNOR circuits are collected by an AND gate circuit 56g and output as a redundancy determination signal HIT.

The select signal SEL is supplied in common to the seven select circuits 56e. The select signal SEL is generated by the AND gate circuit 56f. As has been described with reference to FIG. 14, the select signal SEL remains at the low level when the optical fuse set is in use. In such a case, the select circuits 56e select the optical-fuse side. On the other hand, when the optical fuse set is not in use and the electrical fuse set is in use, the select signal SEL turns to the high level and the select circuits 56e select the electrical-fuse side.

The output of the latch circuit 56ae that latches the optical fuse enable signal LFEN and the output of the latch circuit 56be that latches the electrical fuse enable signal AFEN are supplied to an OR gate circuit 56h. The output of the OR gate circuit 56h is input to the AND gate circuit 56g. Consequently, when neither of the optical fuse set and the electrical fuse set is in use, the redundancy determination signal HIT is fixed to an inactive state.

It is apparent that the present invention is not limited to the above embodiments, but may be modified and changed without departing from the scope and spirit of the invention.

The technical concept of the present invention may be applied to a semiconductor device that includes a core chip or core chips pertaining to volatile and nonvolatile memory cells and an interface chip for controlling the core chip(s). It should be noted that the forms of the circuits in the circuit blocks disclosed in the drawings and other circuits for generating control signals are not limited to the circuit forms disclosed in the embodiment.

The technical concept of the voltage level shift circuit of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention.

That is, it is needles to mention that the present invention embraces the entire disclosure of this specification including the claims, as well as various changes and modifications which can be made by those skilled in the art based on the technical concept of the invention.

What is claimed is:

1. A method for manufacturing a stacked semiconductor memory device comprising:
    testing a plurality of memory chips to detect first defective addresses;
    programming optical fuses with first defective address information on each of the plurality of memory chips that have the first defective addresses;
    stacking the plurality of memory chips;
    testing the stacked memory chips to detect second defective addresses; and
    programming electrical fuses with second defective address information;
    wherein an interface chip is stacked with the plurality of memory chips and the electrical fuses are located on the interface chip.

2. The method as claimed in claim 1, wherein the testing to detect the first defective addresses is performed while the plurality of memory chips are on one or more wafers and the one or more wafers are diced to provide the plurality of memory chips in singulated form prior to stacking.

3. The method as claimed in claim 1, further comprising packaging the plurality of memory chips in resin after stacking.

4. The method as claimed in claim 1, further comprising subjecting the plurality of memory chips to a burn-in test after stacking.

5. The method as claimed in claim 1, wherein the first defective addresses are row addresses.

6. The method as claimed in claim 5, wherein the second defective addresses are row addresses.

7. The method as claimed in claim 5, wherein the second defective addresses are column addresses.

8. The method as claimed in claim 1, wherein the first defective addresses are column addresses.

9. The method as claimed in claim 8, wherein the second defective addresses are row addresses.

10. The method as claimed in claim 8, wherein the second defective addresses are column addresses.

11. The method as claimed in claim 1, wherein the second defective addresses are row addresses.

12. The method as claimed in claim 1, wherein the second defective addresses are column addresses.

13. A method for manufacturing a stacked semiconductor memory device comprising:
    testing a plurality of memory chips to detect first defective addresses;
    programming optical fuses with first defective address information on each of the plurality of memory chips that have the first defective addresses;
    stacking the plurality of memory chips;
    testing the stacked memory chips to detect second defective addresses; and
    programming electrical fuses with second defective address information;
    wherein the plurality of memory chips are, at least at completion of the manufacturing of the stacked semiconductor memory device, connected by a plurality of through silicon vias.

14. The method as claimed in claim 1, wherein the plurality of memory chips are synchronous dynamic random access memories.

15. The method as claimed in claim 14, wherein the plurality of memory chips are double data rate synchronous dynamic random access members.

* * * * *